United States Patent
Lackey et al.

(10) Patent No.: US 7,482,851 B2
(45) Date of Patent: Jan. 27, 2009

(54) LATCH AND CLOCK STRUCTURES FOR ENABLING RACE-REDUCED MUX SCAN AND LSSD CO-COMPATIBILITY

(75) Inventors: David E. Lackey, Jericho, VT (US); Steven F. Oakland, Colchester, VT (US); Peter Verwegen, Rottenburg, DE (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/764,610

(22) Filed: Jun. 18, 2007

(65) Prior Publication Data

US 2008/0042712 A1 Feb. 21, 2008

Related U.S. Application Data

(62) Division of application No. 11/082,990, filed on Mar. 18, 2005.

(51) Int. Cl.
H03K 3/289 (2006.01)
(52) U.S. Cl. .................. 327/202; 327/203; 714/726
(58) Field of Classification Search ............... None
See application file for complete search history.

(56) References Cited

U.S. PATENT DOCUMENTS

| | | | |
|---|---|---|---|
| 4,961,013 A | 10/1990 | Obermeyer et al. | |
| 5,838,693 A | 11/1998 | Morley | |
| 5,920,575 A | 7/1999 | Gregor et al. | |
| 6,066,348 A | 5/2000 | Yuan et al. | |
| 6,300,809 B1 | 10/2001 | Gregor et al. | |
| 6,304,122 B1* | 10/2001 | Gregor et al. | 327/202 |
| 6,625,784 B1 | 9/2003 | Ohta et al. | |
| 6,806,731 B2 | 10/2004 | Kohno | |
| 7,038,494 B2 | 5/2006 | Morton | |
| 2002/0162065 A1 | 10/2002 | Kashiwagi | |
| 2005/0005214 A1* | 1/2005 | Ueda | 714/726 |
| 2005/0216806 A1* | 9/2005 | Verwegen | 714/726 |
| 2006/0095819 A1* | 5/2006 | Bhatia | 714/726 |

* cited by examiner

Primary Examiner—Tuan T Lam
(74) Attorney, Agent, or Firm—Anthony J. Canale; Greenblum & Bernstein P.L.C.

(57) ABSTRACT

An edge triggered system is provided having a data and scan input includes a latch device having a clock input and an AND gate, coupled to the latch device, structured and arranged to receive a first clock signal and an inverted clock signal to generate a clock to the clock input. A process for operating an edge triggered system having a data and scan input includes forwarding a first clock signal to an input of an AND gate. The method includes inverting a second clock signal forwarded to another input of the AND gate and generating a clock input for a latch device from the AND gate.

11 Claims, 18 Drawing Sheets

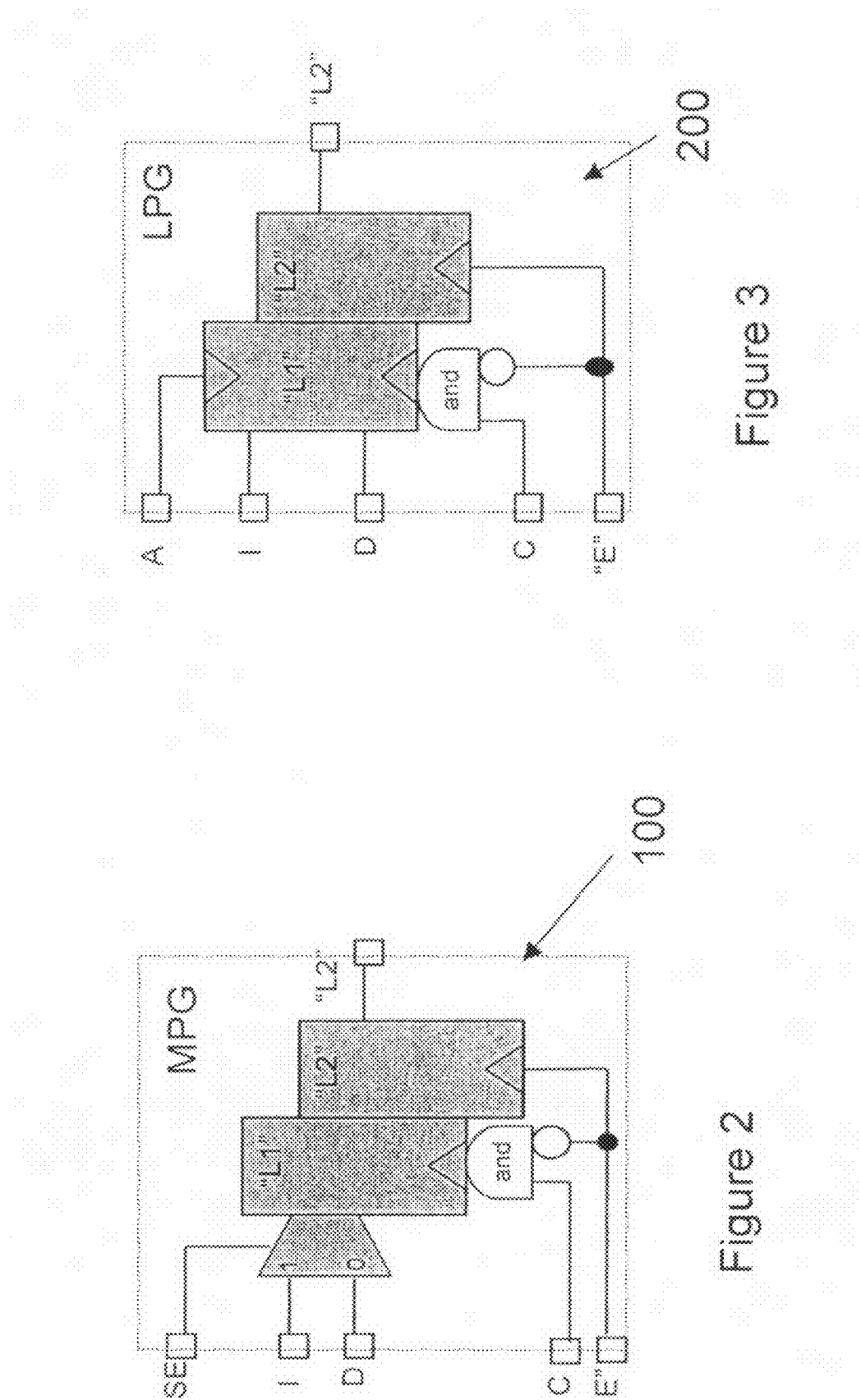

- Applications
  - General purpose retiming latch
  - Asynchronous storage latch
- Functionality
  - Mux-equivalent of LTL latch capability
- Operation
  - System: B=1 (Flush), EN=Enable_N C=1
  - LSSD: B=(-BC), C=(-AS)
  - MuxScan: B,C,EN controlled
- RTL Behavior
  - @(Enable) L2<=D

FIGURE 16

| Sequence | | Edge Clock | LSSD AB | LSSDC | ASST_LOS (1) | ASST_LOS (2) | Flop Mode | Flop State ZC out | Description |
|---|---|---|---|---|---|---|---|---|---|
| System | | Running | AB=01 | 1 | 0 | 0 | Flush | 1 | System Operation |
| LSSD Scan | | Don't care | AB Scan | 0 | 0 | 0 | Flush | Controlled by Shared Structure ZC | Shared Clock Structure controls Latch C (0) |
| Mux Scan | | Running | AB=01 | 1 | 0 | 0 | Flush | Controlled by Shared Structure ZC | Shared Clock Structure controls Latch C (Capture pulse) |
| At-speed LoS | Pulse Pulse Preparation | Stopped (0) | AB=00 | 0 | 0 | 0 | Flush | 0 | After skewed scan load, Flop will contain 0. Edge Clock must be stopped (0) after mux-scan. |
| | | Stopped (0) | AB=00 | 0 | 0 | 1 | Flop | 0 | Set flop to run on next E posedge (Note: for mux-scan, B remains 1) |
| | | Stopped (0) | AB=01 | 1 | 0 | 1 | Flop | 0 | Setup System Mode |
| | | Stopped (0) | AB=01 | 1 | 1 | 1 | Flop | 0 (NS=1) | System Latch C =0, B =0 |
| | Pulse Pulse Sequence | Pulse 1 posedge | AB=01 | 1 | 1 | 1 | Flop | 0 (NS=1) | System Latch C =0, B =0 |
| | | Pulse 1 negedge | AB=01 | 1 | 1 | 1 | Flop | 1 (NS=0) | System Latch L2 pulse |
| | | Pulse 2 posedge | AB=01 | 1 | 1 | 1 | Flop | 1 (NS=0) | System Latch L1 pulse |
| | | Pulse 2 negedge | AB=01 | 1 | 1 | 1 | Flop | 0 (NS=1) | System Latch L2 pulse |
| | Pulse Pulse Post-Process | Stopped (0) | AB=01 | 1 | 1 | 1 | Flop | 0 (NS=1) | NO System Latch L1 pulse |
| | | Stopped (0) | AB=01 | 1 | 0 | 1 | Flop | 0 | System Latch C =0, B =0 |
| | | Stopped (0) | AB=00 | 0 | 0 | 1 | Flop | 0 | System Latch C =0, B =0 |
| | | Stopped (0) | AB=00 | 0 | 0 | 0 | Flop | 0 | Set flop to run on next E posedge (Note: for mux-scan B remains 1) |
| | | Stopped (0) | AB=00 | 1 | 0 | 0 | Flush | 0 | After skewed scan load, Flop will contain 0. Must turn on C prior to next mux scan. |
| Before Return to System | | Stopped | AB=01 | 1 | 0 | 0 | Flush | 1 | (Note: for mux scan, B has been at 1). Next, operate edge clock) |

LATCH AND CLOCK STRUCTURES FOR ENABLING RACE-REDUCED MUX SCAN AND LSSD CO-COMPATIBILITY

CROSS REFERENCE TO RELATED APPLICATIONS

This application is a divisional application of U.S. application Ser. No. 11/082,990, filed on Mar. 18, 2005, the content of which are incorporated by reference herein in their entirety.

FIELD OF THE INVENTION

The invention relates to latches that provide edge-triggered system behavior and improved methods of testing.

BACKGROUND DESCRIPTION

Traditional mux scan is based on edge-clock, and thus requires correct scan and data timing operation to meet hold-time conditions at the input to the L1 latch (FIGS. 1a and 1b). These requirements create a burden on the chip design cycle, in that the chip designer must ensure that all signals in the scan chain (plurality of latch pairs) and data path arrive at each L1 after the edge clock arrives at L1. If, for example, the scan or data (launched by an L2 using a clock edge) arrives at the latch prior to the same active edge of the clock, the latch will capture the incorrect data when it captures the next cycle value.

Additionally, chip testing occurs at a very wide range of operating conditions, e.g., very low and very high voltage, very low and very high temperature, and thus for the chip to be testable all hold time conditions must be met at all operating points. This includes both scan operation (SE=1) as well as data capture operation (SE=0). Also, it is important for latches to be testable using a number of methods for maximum flexibility.

More specifically, FIG. 1a is a mux scan latch which is known to suffer from hold time exposures. FIG. 1b provides master slave behavior; however, this design does not provide edge-triggered behavior within the latch. Instead, the design of FIG. 1b requires two clocks which reduces maximum frequency under which the network can operate, and increases clock wire power consumption and noise risk. In the design of FIG. 1b, the latch does not provide edge triggered behavior and requires external circuitry to achieve the edge triggered behavior. Specifically, the design of FIG. 1b must include an external phase splitter to allow control over L1 (C) and L2 (B) clocks, in both the positive and negative phase paths.

SUMMARY OF THE INVENTION

In a first aspect of the invention, an edge triggered system having a data and scan input includes a latch device having a clock input and an AND gate, coupled to the latch device, structured and arranged to receive a first clock signal and an inverted clock signal to generate a clock to the clock input.

In a second aspect of the invention, a process for operating an edge triggered system having a data and scan input includes forwarding a first clock signal to an input of an AND gate. The method includes inverting a second clock signal forwarded to another input of the AND gate and generating a clock input for a latch device from the AND gate.

In another aspect of the invention, an edge triggered system comprising a latch device and an AND gate structured and arranged to operate the latch device under control of a single edge clock signal.

BRIEF DESCRIPTION OF THE DRAWINGS

FIG. 2 illustrates a first embodiment in accordance with the invention;
FIG. 3 illustrates a second embodiment in accordance with the invention;
FIG. 16 shows a clock domain control for the At-speed LoS.

DETAILED DESCRIPTION OF EMBODIMENTS OF THE INVENTION

The invention is directed to latch designs that provide edge-triggered system behavior and improved methods of testing. The invention provides the following features, amongst others, as further described below:

The ability to be tested as LSSD (Level Sensitive Scan Design);
The ability to be tested as mux-scan;
The ability for a mux-scan testable chip to avoid hold-timing exposures;
The ability for a mux-scan testable chip to be tested using separate master and slave clocks;
The ability to operate the chip in any of the test modes;
The ability to operate the latch design in the system operation under control of a single edge clock signal. This feature minimizing clock wire power consumption and corresponding electrical noise;
The ability to support fully-testable asynchronous data capture operation;
The ability to support functional clock gating;

The ability to support asynchronous set and reset operation;

The ability to be tested using at-speed launch off scan methods; and

The ability to minimize the chip area necessary to accomplish all of the above.

FIG. 2 shows a first embodiment in accordance with the invention. The first embodiment is a one port L1 latch driven by a mux, referred to as a muxed pulsed gate (MPG) 100 used edge trigger system operation. In a first mode of operation, the MPG 100 provides an edge clock function (e.g., L1 inverted and L2 in-phase) internal to the latch-pair when C=1. The MPG 100 of FIG. 2 includes a mux, a first latch, L1 and a second latch, L2. The data input is muxed between system and scan operation under control of SE. In this implementation, the mux can select between the I pin, which is the scan input, and the D pin, which is the data input, both operating under the control of a single clock which is the output of the "AND" gate.

Figure 1B:
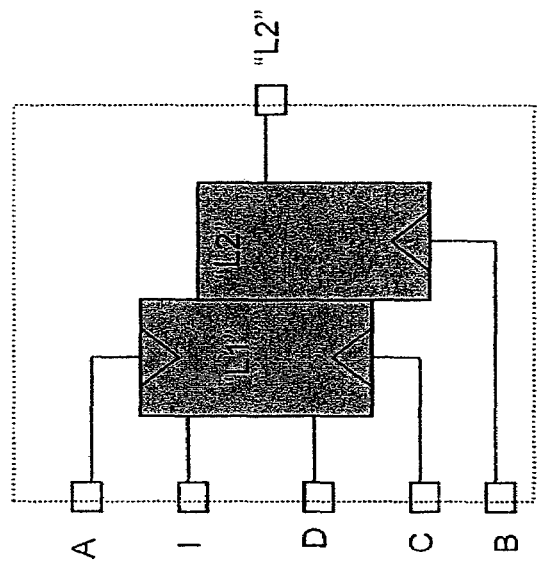
FIGS. 1a and 1b illustrate conventional latches.
Figure 1A:
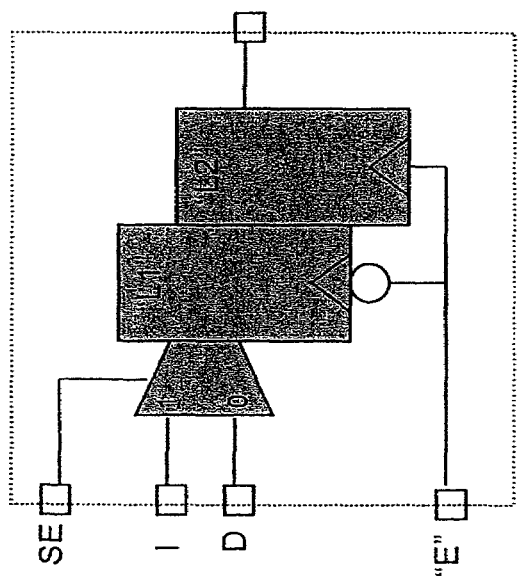

In FIG. 2, in a second mode of operation, the C pin is the L1 clock, the SE pin is the control signal to the mux, and the E pin is the L2 clock. The data input is muxed between system and scan operation under control of SE, providing equivalent operation as shown in FIG. 1a; however, the C pin can be controlled independently, which provides master-slave operation by operating the C pin (L1 clock) and the E pin (L2 clock), independently.

In FIG. 2, in a third mode of operation, the C pin is a gate of the L1 data clock which in turn is the inverted value of the E pin, the SE pin is the control signal to the mux, and the E pin is the L2 data clock. This provides edge-based operation of the MPG, selecting either the I pin or D pin under control of SE. Additionally, the C-pin can also be used to block the clock to the L1 latch when C=0, due to the function of the AND gate.

FIG. 3 is representative of a second embodiment of the invention. The second embodiment is a two-port latch with no mux, referred to as a latched pulsed gate (LPG), used for edge trigger system operation. The LPG 200 provides the edge clock function (L1 inverted and L2 in-phase) internal to the latch-pair when C=1. The LPG 200 can capture data input when the C-pin (C clock) is active, and scan data when the A-pin (A clock) is active. The LPG's edge clock (E) is also fed by an SCSP ZE output shown in FIG. 4 (or either the ZEP or ZEN output of an SCSPN shown in FIG. 6), and like MPG operates in a first mode of operation as an edge-triggered flop when (TE=MT=SE=A=0, B=C=1) using the circuit shown in FIG. 8 which creates the waveform shown in FIG. 9. It is also fully LSSD compatible with independent operation of (A,B, C). In the embodiment shown in FIG. 4, TE=1 allows B to propagate to ZE, however this is non-limiting in that B and E can be the same signal and therefore SCSP and therefore TE=1 is not required.

By way of example, all the test clocks (A B C) are pulsed to 1 individually for controlling the latches. Illustratively, A clocks pulse L1's for loading scan values (I pin) into L1;

C clocks pulse L1's for capturing data values (D pin) into L1; and

B clocks pulse L2's for capturing the L1 value into L2.

For LPG, all the above pins exist. For MPG, the A clock and the C clock are combined as a single L1 clock (C-pin), and the SE control pin is used to determine whether L1 loads scan (I) or data (D) value.

Thus, in FIG. 3, in a second mode of operation the C pin is the L1 data clock, the A pin is the L1 scan clock, and the E pin is the L2 clock. In implementation of FIG. 3, the C pin can be controlled independently, which provides master-slave operation by operating the C pin (L1 clock, and the E pin (L2 lock)) independently. Additionally, the data is captured using the clock that is the output of the "AND" gate, and the I input is captured using the A clock. One of the advantages of the LPG 200 is that in most circuit designs it is faster, e.g., the delay from D to L2 is less, because there is no mux.

Accordingly, the embodiments of FIGS. 2 and 3 provide the ability to operate latch design under control of a single edge clock signal, provided by the function of the "AND" gate. This feature minimizes clock wire power consumption and electrical noise, as well as being capable of utilizing all scan methods. By minimizing the power consumption and electrical noise, timing behavior of the network is improved. Also, in implementation, the embodiments of FIGS. 2 and 3 allow for an increased frequency under which the network can operate and can both operate the chip in any of the test modes described.

Figure 4:
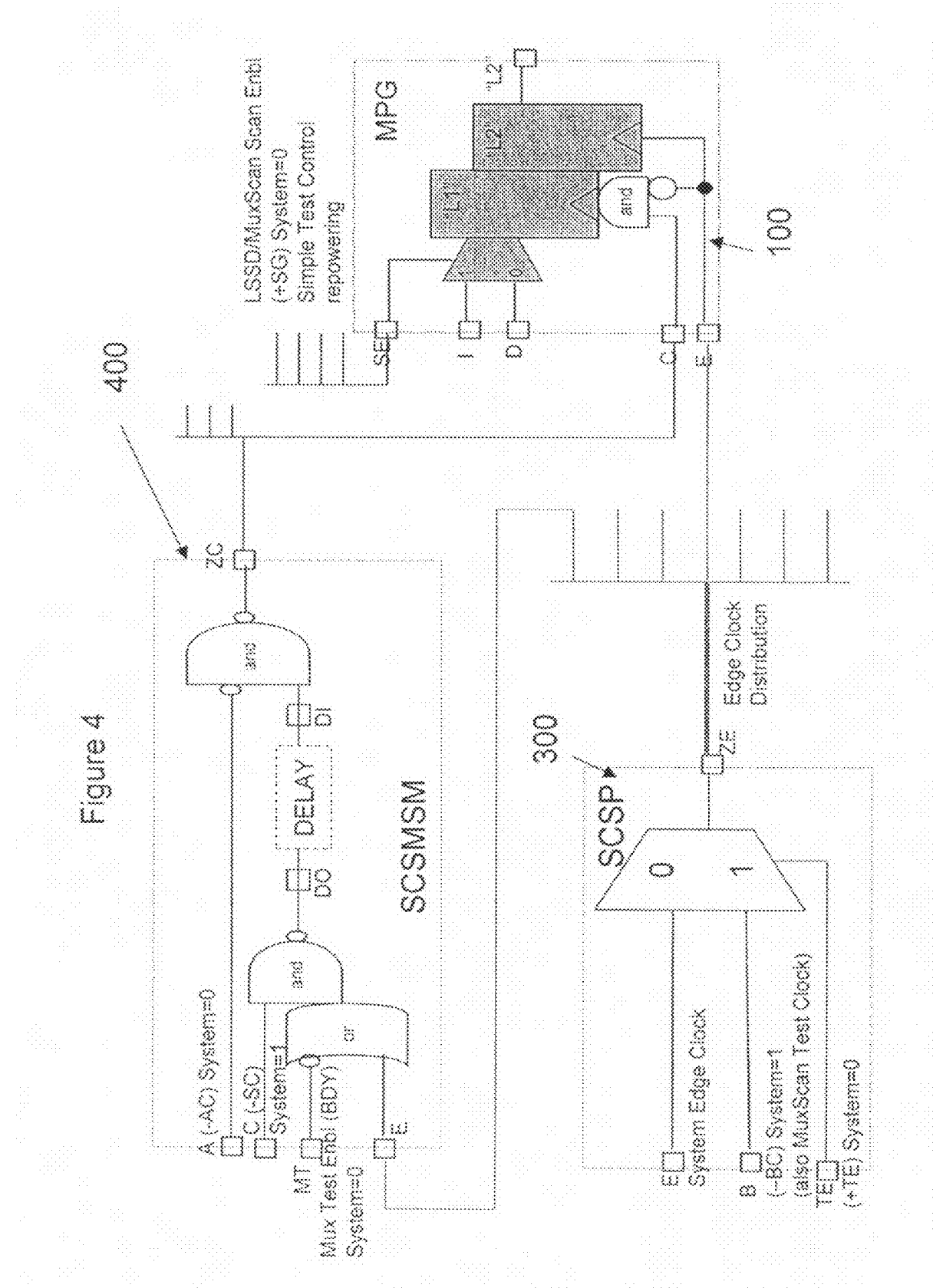
FIG. 4 illustrates a system for clock control in accordance with the embodiment shown in FIG. 2.

FIG. 4 shows a system for full clock control of latch-pairs. In the implementation of FIG. 4, a shared clock structure for positive edge clock (SCSP) 300 is connected to the E pin of the MPG 100. Also, a shared clock structure mux scan for MPG latches (SCSMSM) 400 is connected to the C pin of the MPG 100. The SCSP includes a system edge clock input E, a Muxscan Test clock input or LSSD slave test clock input, B, and a test mode signal input, TE. The SCSP 300 provides (i) the latch plurality's edge clock signal E (to clock distribution network), and (ii) control to signal B selected by of test enable TE, whereas in system operation (TE=0) the signal E is controlled by the system.

In the implementation, when TE=0 (system mode), the top signal "0" (system clock) is selected and when TE=1 (test mode), the bottom signal "1" (test clock) is selected. In the system mode operation, TE=0, the system edge clock signal, E, is selected to control the ZE signal (positive signal). This positive edge signal is sent to the E pin on the MPG latch 100; that is, in system operation (TE=0), the signal E is controlled by the system edge clock.

Still referring to FIG. 4, the SCSMSM 400 includes an A input, C input, MT (mux test enable) input and an E input. In the test mode, TE=1, a signal is sent to the SCSMSM 400 to enable the mux scan test mode, where MT=0, C=1 and A=0. In this mode, MPG 100 operates as edge-triggered mux-scan.

In a mode of edge-triggered mux scan that avoids hold-timing exposure, MT=1, C=1, and A=0. In this mode, a delayed version of E is provided to output ZC. The output of ZC is then provided to input pin C of the MPG 100. Accordingly, the SCSMSM 400 provides an edge-based mux scan that avoids hold-timing exposure.

By way of further non-limiting discussion, the SCSMSM 400 uses the C pin controllability in the following manner. The edge clock E is delayed (DELAY function) when MT=1 such that the delayed E signal (ZC) arrives at the plurality of latch pairs after the arrival of the E signal. Inside the latch pair circuit of the MPG 100, the AND function (not E) AND (delayed E) produces a chopped pulse to the L1 clock. This allows for race-free operation at the latch, removing the need to solve hold-time considerations at the various required operating conditions. The DELAY can be either internal or external to the SCSMSM 400; although an external DELAY provides late tuning capability to the chip designer in ensuring that delayed E arrives at the latch-pair C pin after E and results in adequate pulse width of the chopped L1 clock. This implies a timing analysis is required; however, the analysis and the fixing of any timing issues becomes substantially easier than fixing hold time issues of either/both the scan path and the data path over the entire range of operating voltage/temperature that must be applied in chip testing. The remaining circuitry of the SCSMSM provides LSSD compatibility (A and C clocks) to the latch pair C pins.

Additionally, the combined function of the SCSP 300 and SCSMSM 400 allows the chip design to be compatible to both LSSD (e.g., A, B, C independently control all latch clocking), traditional edge-based mux scan (MT=0 and therefore MPG C pin is controlled by the C-pin of the SCSMSM 400), as well as the (DELAYED E) mux-scan operation in which hold-time issues are avoided (the latter is referred to as "race-mitigated mux-scan). The latch pair also provides edge-based system functional operation (e.g., MT=SE=A=TE=0, and B=C=1) at the inputs of SCSP 300 and SCSMSM 400.

An additional value of a chip that operates as both LSSD and Mux-Scan allows for a system-on-chip mix of design blocks, some pre-designed with LSSD and some with mux-scan. The LSSD B clock and the Mux-Scan Edge clock share a common signal at a SCSP input, and this allows a single chip input to be used as the mux-scan edge clock, or as the LSSD B (slave, or L2) clock. The remaining chip design, when using this invention, then has significant flexibility for testing under various modes needed by the various pre-designed blocks. For example, the race-mitigated aspect in particular shortens the design cycle (e.g., timing analysis and timing solution schedule duration) by removing the necessity of solving hold-time requirements of edge-based mux-scan for the new chip logic, across the ranges of voltage and temperature required for testing of the chip. In all cases, race-mitigated mux-scan can also be operated by controlling the chip C input (similar to LSSD) separately (rather than as a delayed edge clock) which provides a master-slave clocked mux-scan capability.

Figure 5:
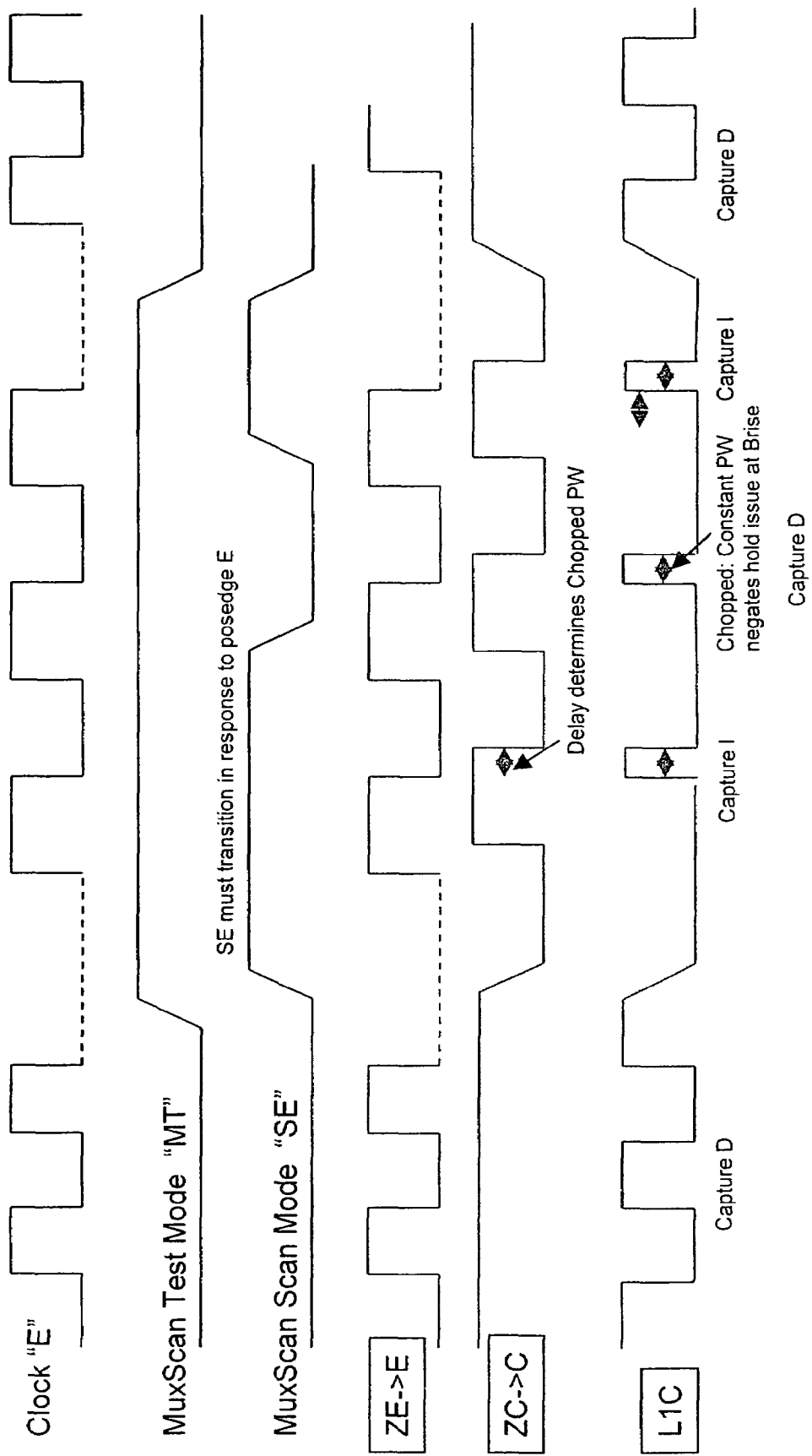
FIG. 5 shows a timing chart in accordance with the use of the embodiment shown in FIG. 4.

FIG. 5 shows a timing chart in accordance with the use of the embodiment shown in FIG. 4. More particularly, FIG. 5 shows operation of the MPG 100 latch-pair and clock structures in both system functional operation (MT=SE=0) and race-mitigated mux-scan (MT=1 and SE controls scan and data capture at the latch-pairs). As shown in FIG. 5, the signal at the SCSP 300 provides a waveform which is delayed by SCSMSM 400 (e.g., ZC.fwdarw.C); the delay determines the pulse width at the L1 clock. That is, the C value and inverted value of E (using the AND gate) form L1C, where L1C represents the output of the AND gate of the MPG and is the L1 clock). Thus, as shown, the delay, which is designated as a diamond on ZC.fwdarw.C, determines the chopped pulse width duration. By having such chopped L1 clock, race conditions are avoided at "E". In LSSD operation, the MT signal can be tested in both states.

Figure 6:
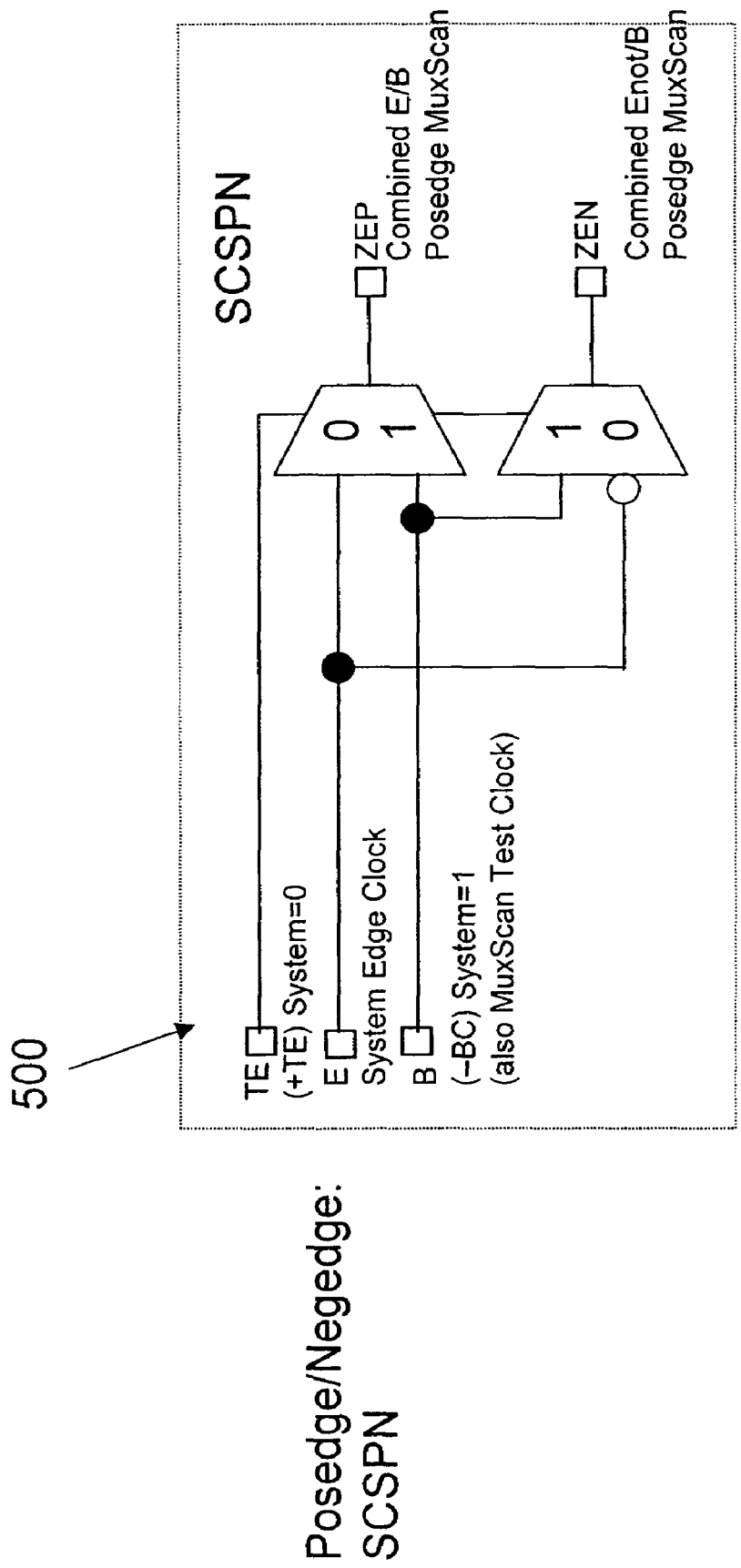
FIG. 6 is representative of a shared clock structure in accordance with the invention.

FIG. 6 shows a circuit representation for creating both a positive edge trigger and negative edge trigger for the system environment. In FIG. 6, a circuit 500 (shared clock structure for positive and negative edge clock (SCSPN)) is shown for creating both a positive edge trigger, ZEP (combined positive edge system clock, LSSD B, and positive edge muxscan clock E), and negative edge trigger, ZEN (combined negative edge system clock, LSSD B, and positive edge muxscan clock), to the MPG 100 latch, L1 and L2. The SCSP, as previously discussed, is also shown which provides a positive edge clock. The MPG 100, fed by ZEP, will operate on an edge clock in phase with the System Edge clock in system operation, whereas those fed by ZEN will operate on the edge clock's opposite phase in system operation. However, both the in-phase (ZEP) and opposite-phase (ZEN) edge clocks are controlled in-phase by the B signal (which is shared as LSSD B clock and mux-scan edge clock) for test operation.

More specifically, the SCSPN 500 includes a system edge clock input E, a Muxscan Test clock input B and a test mode signal input TE. In the implementation, when TE=0 (system mode), the top signal "0" (system clock) is selected; whereas, when TE=1 (test mode), the bottom signal "1" (test clock) is selected. (This same categorization applies throughout the description.) In the system mode operation, TE=0, the system edge clock signal, E, is selected to control the ZEP signal (positive signal). This positive edge signal is sent to the E pin on the MPG latch 100; that is, in system operation (TE=0), the signal E is controlled by the system edge clock. However, in test mode, TE=1, the test clock signal B, is selected to control the ZEP signal; that is, in test operation (TE=1), the signal E is controlled by the test clock.

In the system mode operation, TE=0, the system edge clock signal, E, is selected and inverted to control the ZEN signal. This negative edge signal is sent to the E pin on the MPG latch 100; that is, in system operation (TE=0), the signal E is controlled by the inverted system edge clock. However, in test mode, TE=1, the test clock signal B, is selected and is not inverted to control the ZEN signal; that is, in test operation (TE=1), the signal E is controlled by the in-phase test clock.

Figure 7:
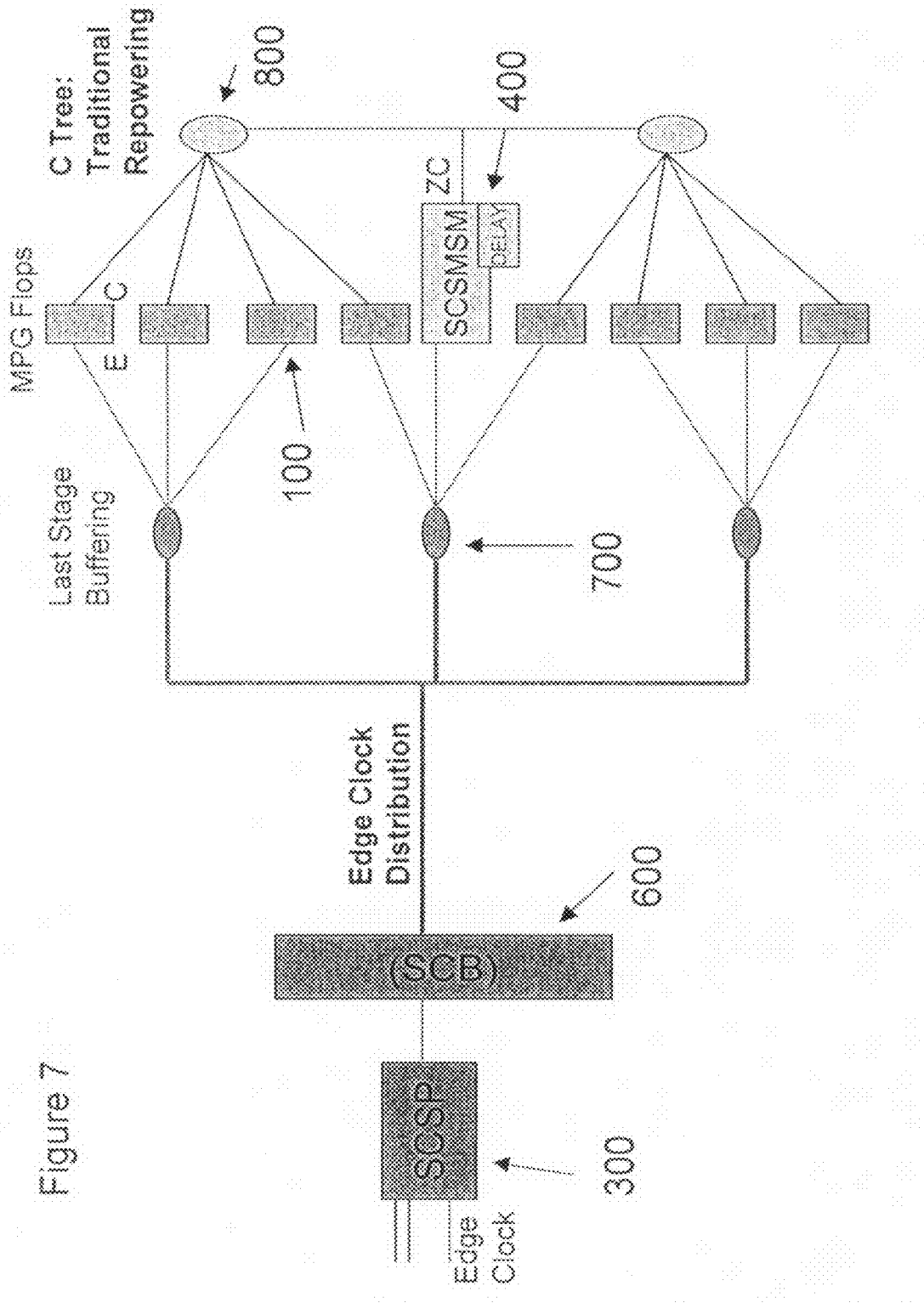
FIG. 7 shows a clock distribution view using a plurality of clock buffers in accordance with the embodiment shown in FIG. 4.

FIG. 7 is one example of a clock distribution implemented for a plurality of MPG 100 latch-pairs, and the LSSD and edge-based clock control needed for test operation. In this aspect of the invention, a structured clock buffer 400 (SCB) is an example of a clock buffer feeding the spine (or source) of the clock tree (e.g., clock distribution), with additional clock buffers 700 shown as an example. The SCSMSM receives the E input to create the ZC signal. The ZC signal goes through the repowering tree 800 to the C input.

By organizing one SCSMSM 400 at the end of the Edge clock distribution as shown, and then providing a C tree distribution to the C-pin of all MPGs 100, the pulse width requirement of the L1 clocks of the MPG 100 is easily met. The flop's SE pin (not shown) is fed by test control repowering from test-only CE0_SE chip input or internally generated signal.

The timing requirement of the L1 clock for race-mitigated mux-scan operation is shown as:

(Edge_Tree_Latency+DELAY_cell+SCSMSM delay+
   C_Tree_Latency) must be greater than (Edge_
   Tree Latency+L1 clock pulse width requirement)

Figure 8:
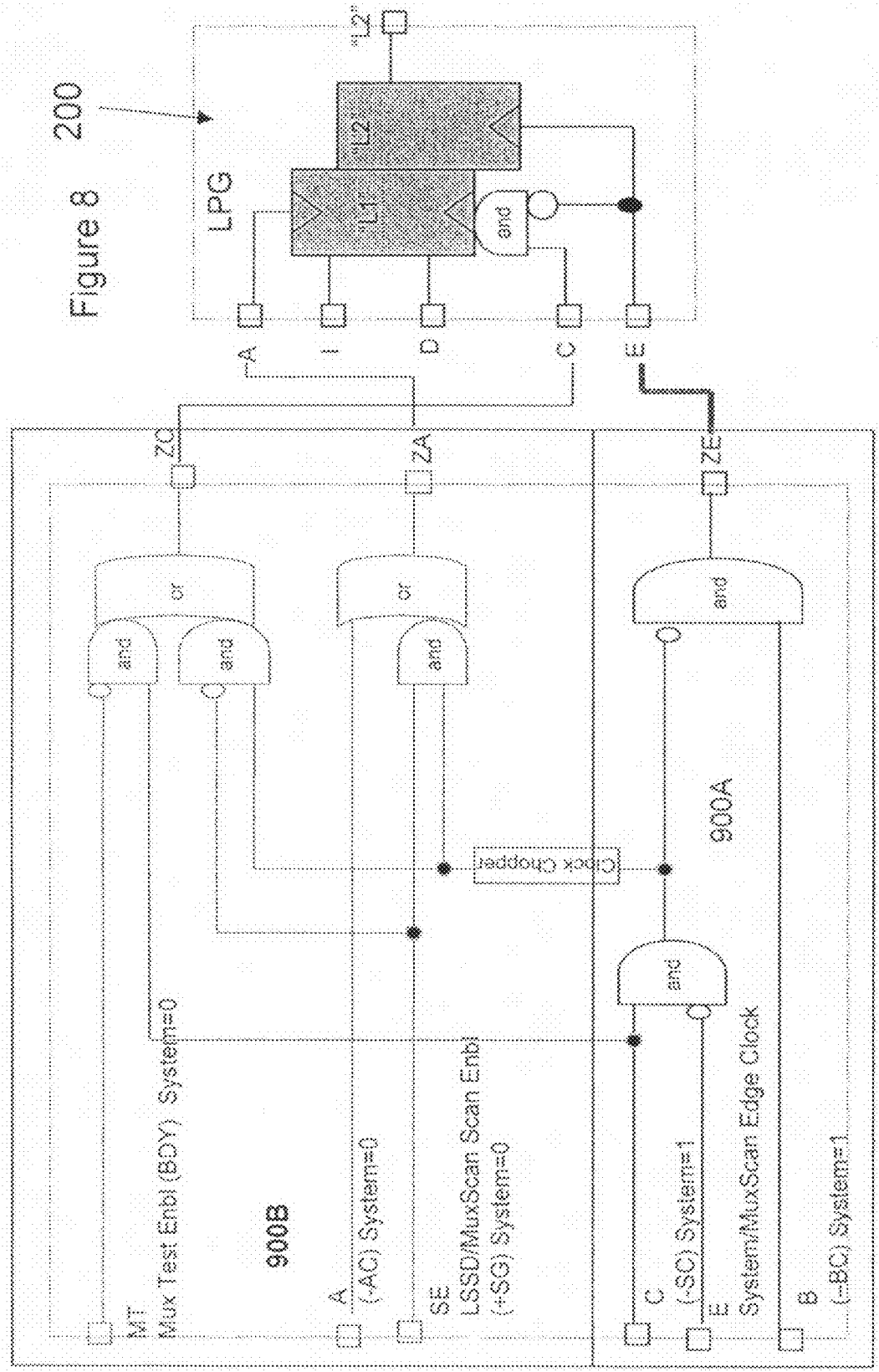
FIG. 8 shows an embodiment for providing a chopped clock for the LPG(s)

FIG. 8 shows an embodiment for providing a chopped clock for the LPG(s) 200. The circuitry of FIG. 8 shows a first circuitry portion 900A and a second circuitry portion 900B. The first circuitry portion 900A includes inputs E, B, C and output ZE. This is an example of alternative circuitry for the SCSP 300 shown in FIG. 4. In the case of LPG 200, the SCSPN can be used with the LPG(s) 200 for creating both positive and negative edge clocks for system operation, similar to the case for the MPG(s) 100. Single performance-critical clock allows repowering to be added at the path between ZE and E. Therefore shared structure can be at clock root.

The second circuitry 900B is an alternate circuitry to the SCSMSM 400 of FIG. 4, which can be implemented for use with the LPG cell 200. For example, when MT=1 and when scan enable is low, SE=0, ZC provides a signal to the C pin; whereas, when MT=1 and when scan enable is high, SE=1, ZA provides a signal to pin A. The circuitry portion 900B provides mux scan capabilities for the LPG 200; otherwise Latch A and C can be direct connects to -AC (system=0) and -SC (system=1), which results in edge-triggered system operation of the LPG 200 when A=0 and C=1, and results in LSSD operation with independent control of -AC and -SC. Additionally, in the circuitry of 900B, scan and Test clocks (LSSD & mux scan combined) are non-critical and can be repowered independently.

Figure 9:
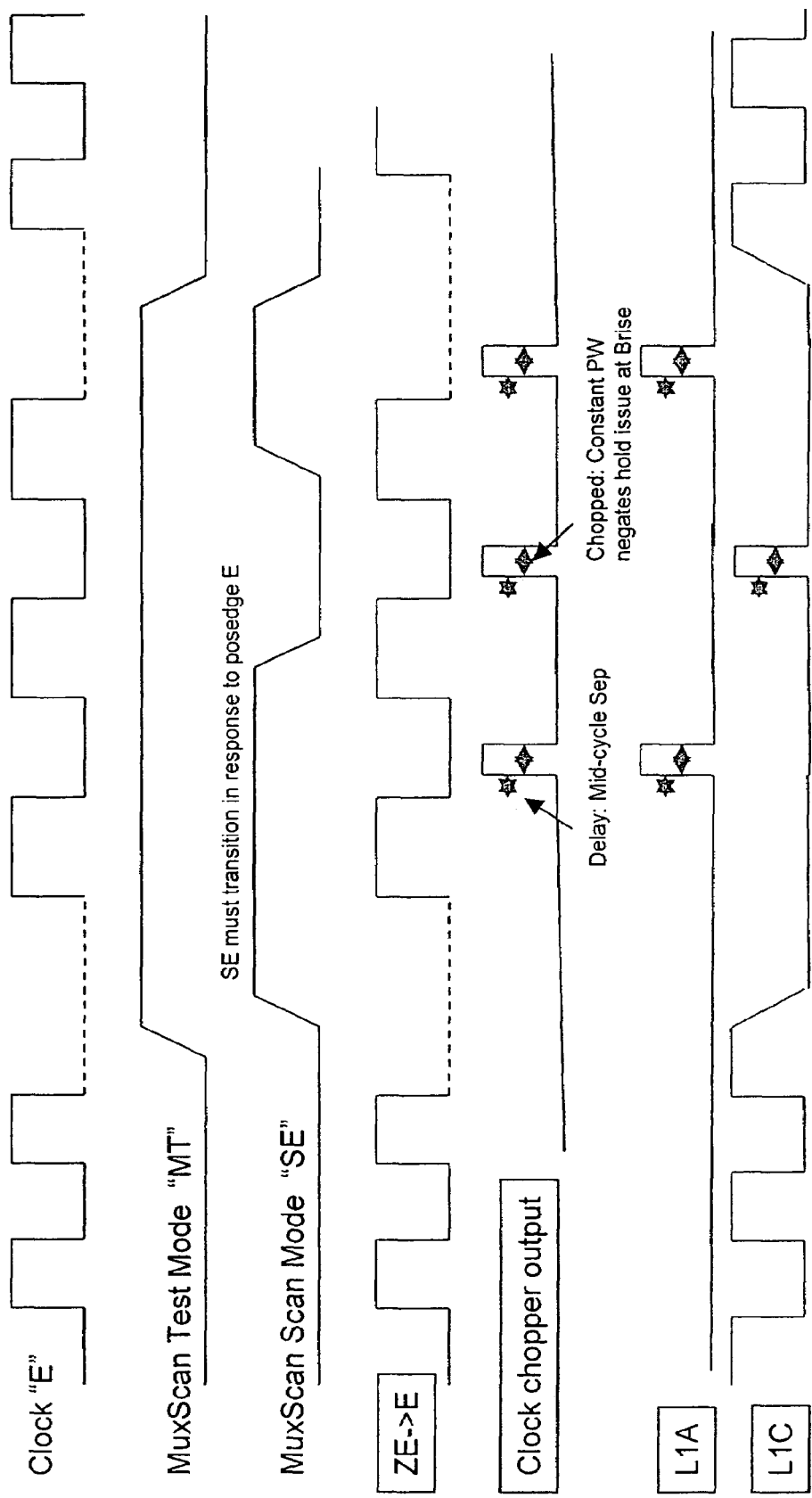
FIG. 9 shows an additional embodiment of a race-mitigated mux-scan structure for LPG; Is this at the bottom of the FIG. 8 (it isn't labeled that way currently)?

FIG. 9 shows an embodiment of a race-mitigated mux-scan structure for LPG 200. In this case, a chopped pulse is created from the negative phase of the edge clock, and this is used to clock A (L1A) during mux-scan testing when SE=1. This is also used to clock C (L1C) during mux-scan testing when SE=0.

Figure 10A:
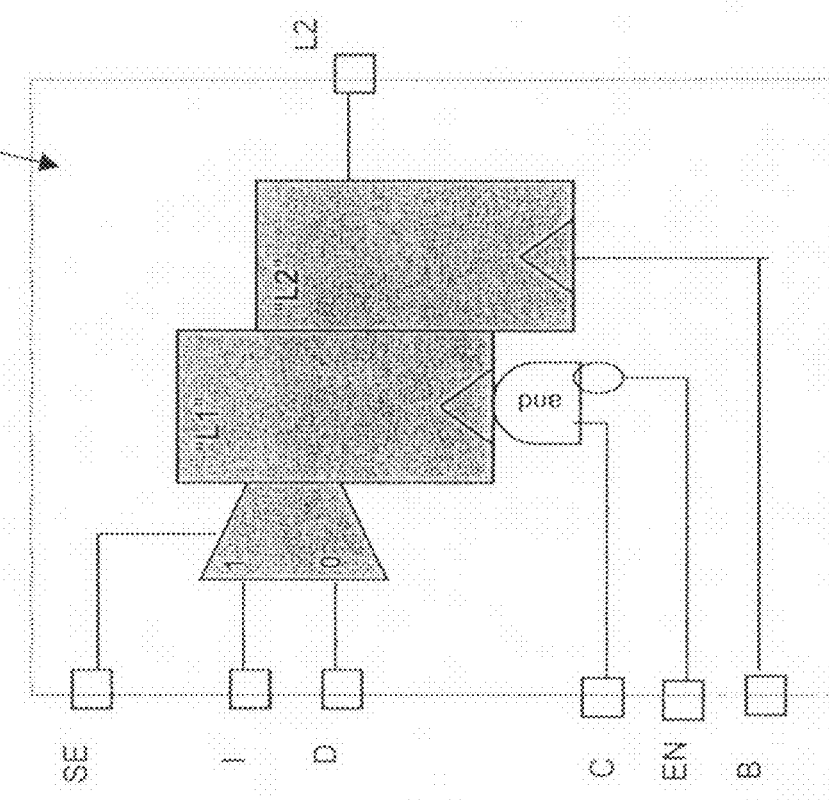
FIGS. 10a and 10b show an embodiment of MTL in accordance with the invention.
Figure 10B:
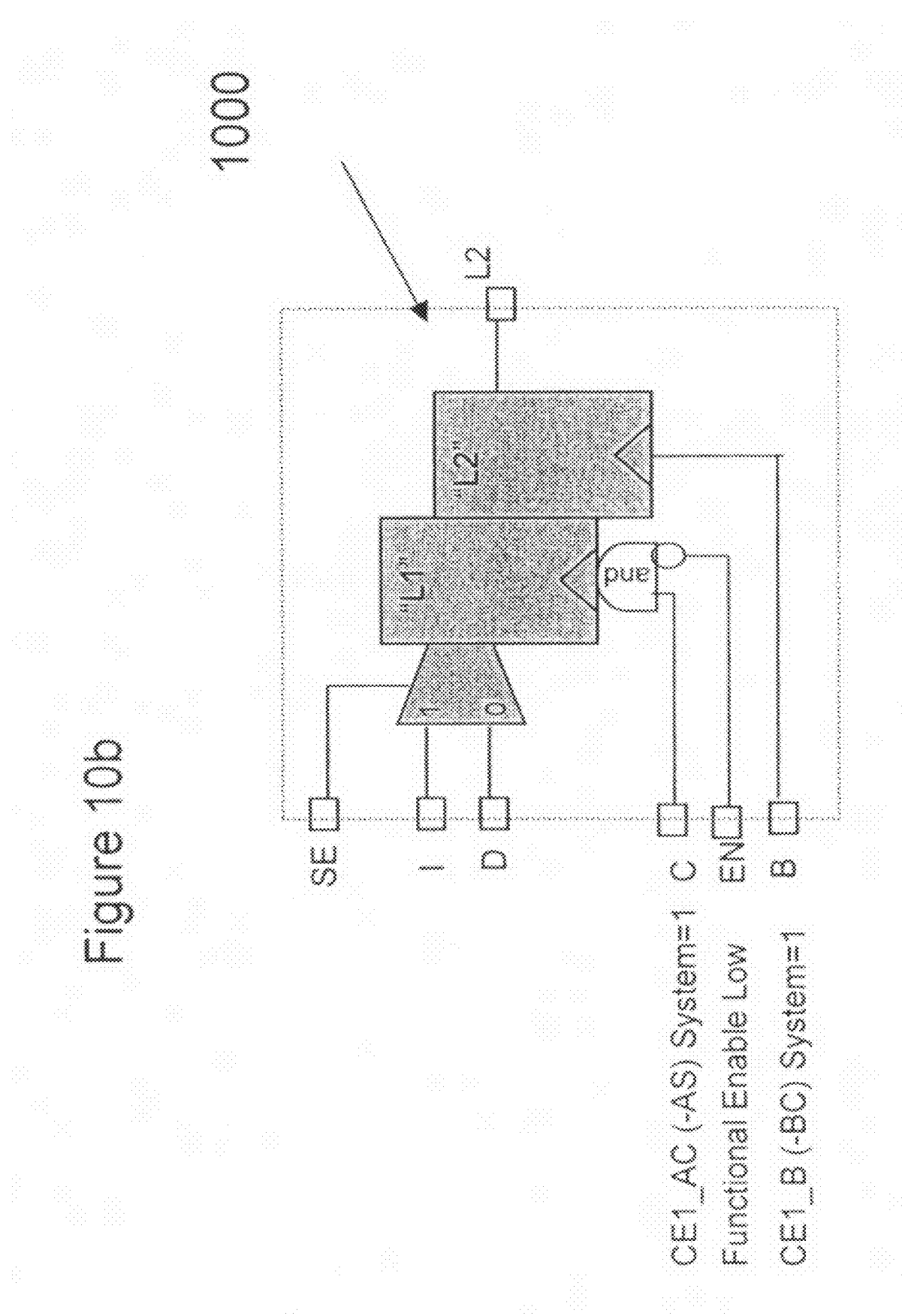

FIGS. 10*a* and 10*b* show an additional embodiment of the invention. In this embodiment, a latch-pair circuit 1000, i.e., MTL (similar to MPG's in that it allows LSSD, edge-based mux scan and "race-mitigated mux-scan) supports LSSD test.

The MTL 1000 provides transparent latch behavior and is intended for level sensitive system operation, e.g., the L1 captures when EN=0. Applications are for general purpose retiming latch and asynchronous storage latch. The functionality of the embodiment includes LTL latch capability in which the 1 port L1 and mux (MTL) can be replaced by a 2-port L1 with no mux (LTL), similar to the difference between (MPG) and (LPG).

In the case of the MTL 1000, two signals are now provided, compared with a single signal for the MPG case. In one implementation, the B pin is always held high, B=1, and the data in L1 immediately goes to the output L2 when EN=0. That is, L2 is in flush mode. Also, when C is held high (C=1) and EN=0, using the MTL 1000, level sensitive behavior is accomplished, rather than edge trigger behavior. In this case, the L1 captures data while the entire time EN=0 so that the data is immediately available at L2. The MTL 100 can be considered a retiming latch or an asynchronous storage latch; however, for testing, the MTL 1000 still provides all capabilities for positive edge-triggered mux scan operation using the mux 401 shown in FIG. 11, and is not susceptive to hold time exposure using the SCSMSM 400 show in FIG. 11. MTL also provides LSSD behavior through independent operation of B and C.

As a comparison, in the MPG 100 the signal that drives the inverted AND gate input is the same signal to the L2 latch. In the MTL 1000, two signals are now provided, B and EN. The EN signal drives the inversion to the AND gate and the B signal drives the L2 latch. It is noted that the MTL 1000 differs from MPG 100 in the system functional operation. For example, the MPG 100 can be considered a "positive edge-triggered flop"; whereas, the system function of MTL 1000 is that of an asynchronous latch which captures data (D) when EN is low, and holds data when EN is high. Therefore EN is a "functional enable low".

Figure 11:
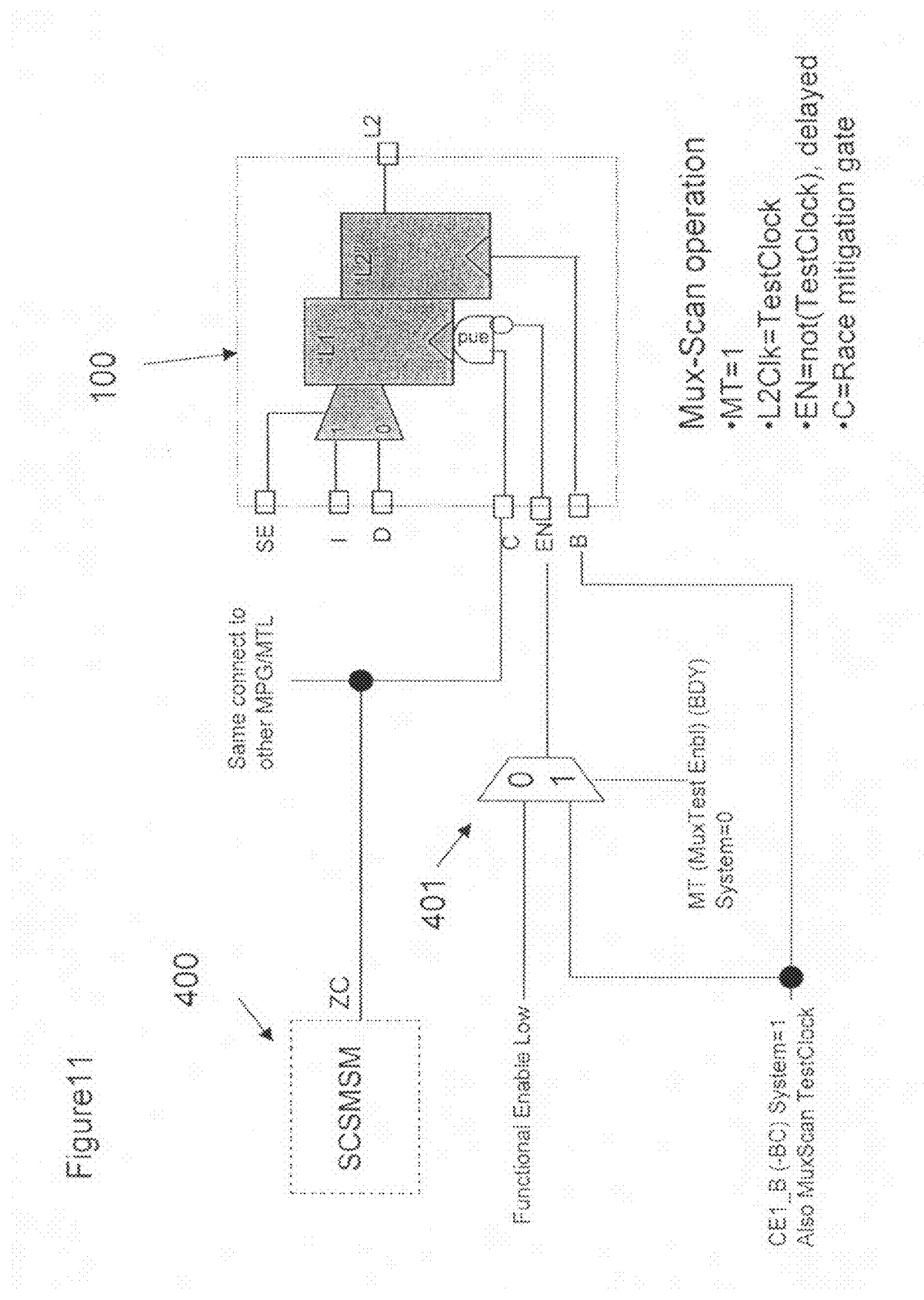
FIG. 11 shows an implementation of an MTL in accordance with the invention.

FIG. 11 shows the MTL 1000 used to support LSSD, and support edge-based/race-mitigated mux scan (MT=1), and support system operation (MT=0). Although not shown, the MTL 1000 can also be implemented with a 2-phase L1, replacing the 1-phase L1 and input mux of the MPG (this alternate embodiment is referred to as LTL, as previously discussed). In one implementation, as shown in FIG. 11, the EN pin will receive input from the MuxScan TestClock (CE1_B) on the path to L1. In this path, the signal is inverted at the AND gate. (There is no requirement for the SCSP; instead input is received directly from the MuxScan TestClock, which allows operation under muxscan.) In this implementation, MuxScan TestClock goes directly to the B input, but also to EN when in the mux-scan mode MT=1, thus supporting positive edge-triggered mux scan operation.

Figure 12:
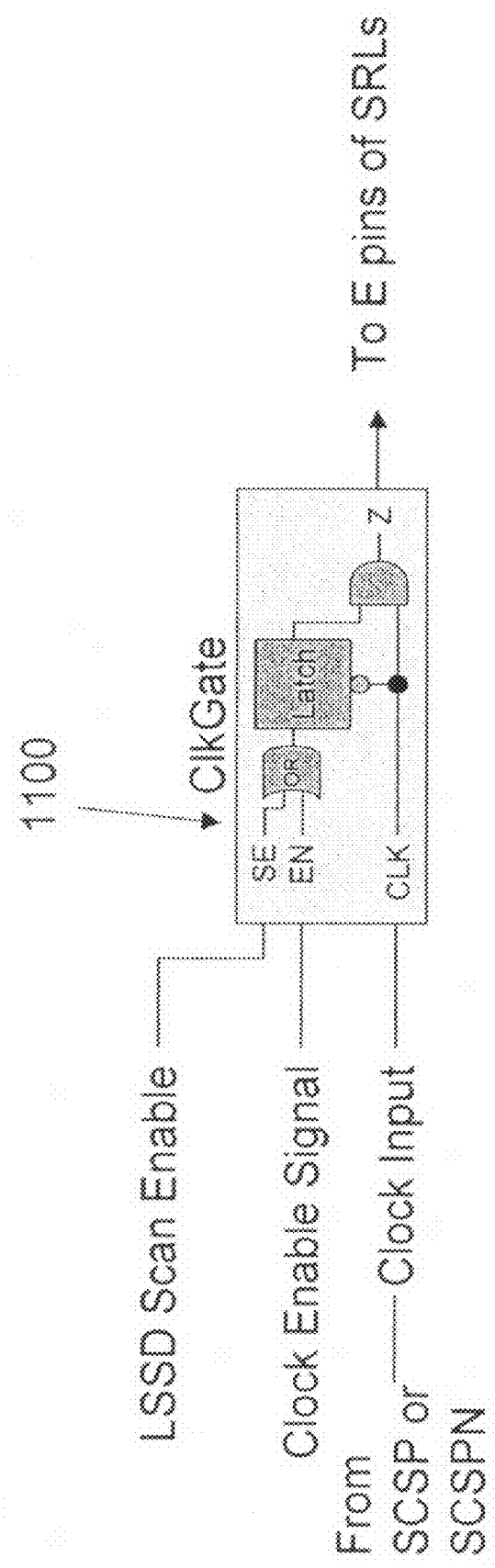
FIG. 12 shows a clock gate cell used in accordance with the invention.

FIG. 12 shows a clock gate cell 1100 used with the MPG 100 or LPG 200 and related structures. In one implementation, clock gating is useful for reducing clock power when the clock is not needed at the latches (when a signal "Clock Enable Signal" indicates that the latches are to hold their current values in the next cycle). In a non-limiting implementation, the clock repowering may appear on either side of clock gate cell.

The clock gate cell 1100 of FIG. 12 shows AND gates into the clock signal (between SCSP/SCSPN and the plurality of latch pairs). In one non-limiting illustrative example, the latch shown in the clock gate cell 1100 passes the Clock Enable Signal when the edge clock (clock input) is low (immediately forcing the Latch E pins low when Clock Enable is low), and holds the Clock Enable Signal when the edge clock (clock input) is high (forcing the Latch E pins to remain low when Clock Enable is low and the Clock Input next becomes low, until the next Clock Input=1 and the Clock Input next becomes high), thus producing race-free operation at the AND gate. During scan operation, the Scan Enable signal, SE, may be the same SE signal used by the MPG latches, which is held (i) low for system function operation and data capture during test, and (ii) high for scan operation during test.

Figure 13:
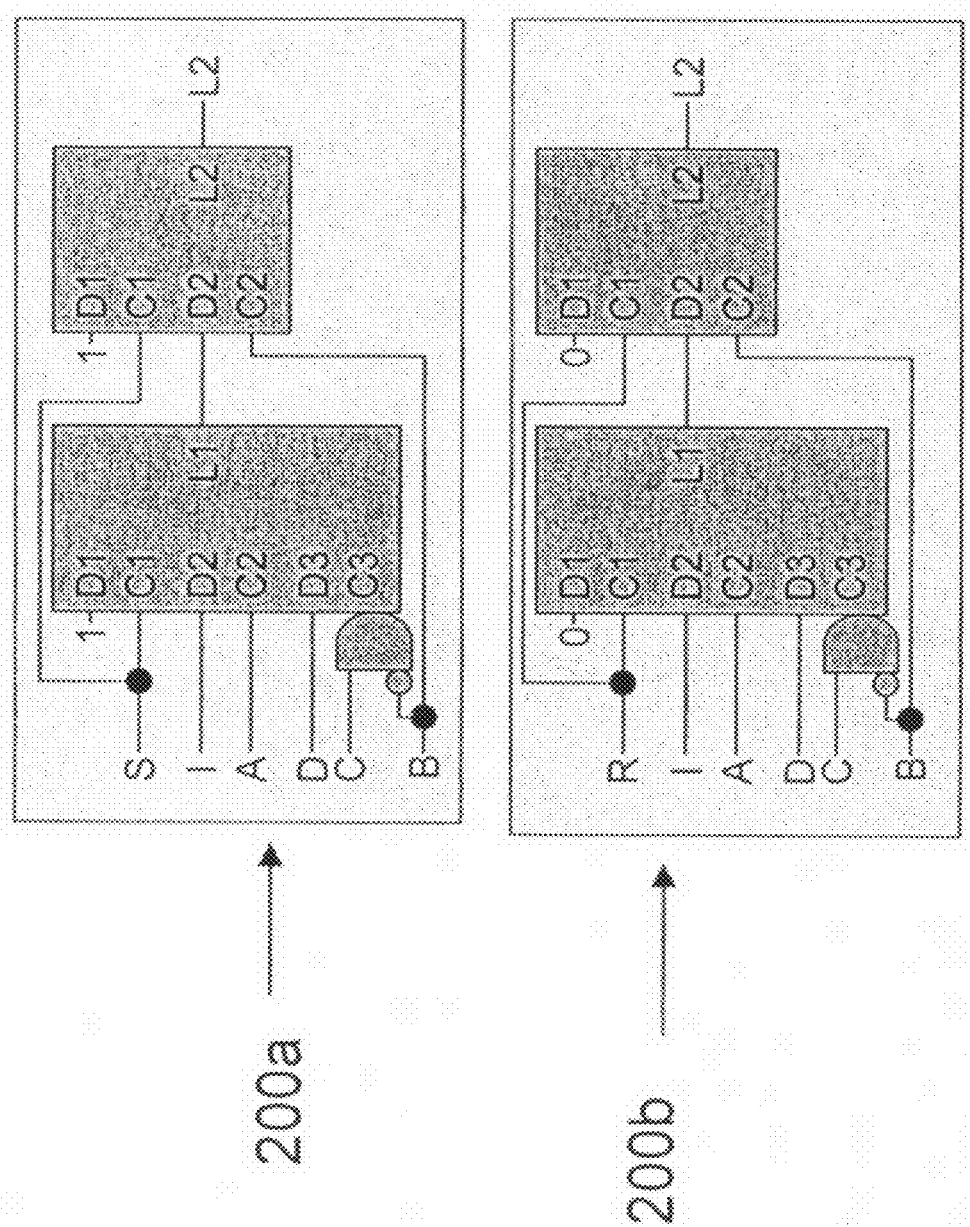
FIG. 13 shows an asynchronous set/reset circuit used in embodiments of the invention.

FIG. 13 shows LPG latches extended with asynchronous Set and Reset capability, 200*a* and 200*b*, respectively. The MPG latches may be extended in an identical manner. In this illustrative implementation, R and S pins are added such that when S=1, the latches are set and when R=1, the latches are reset (see latch inputs named C1 and D1).

Figure 14:
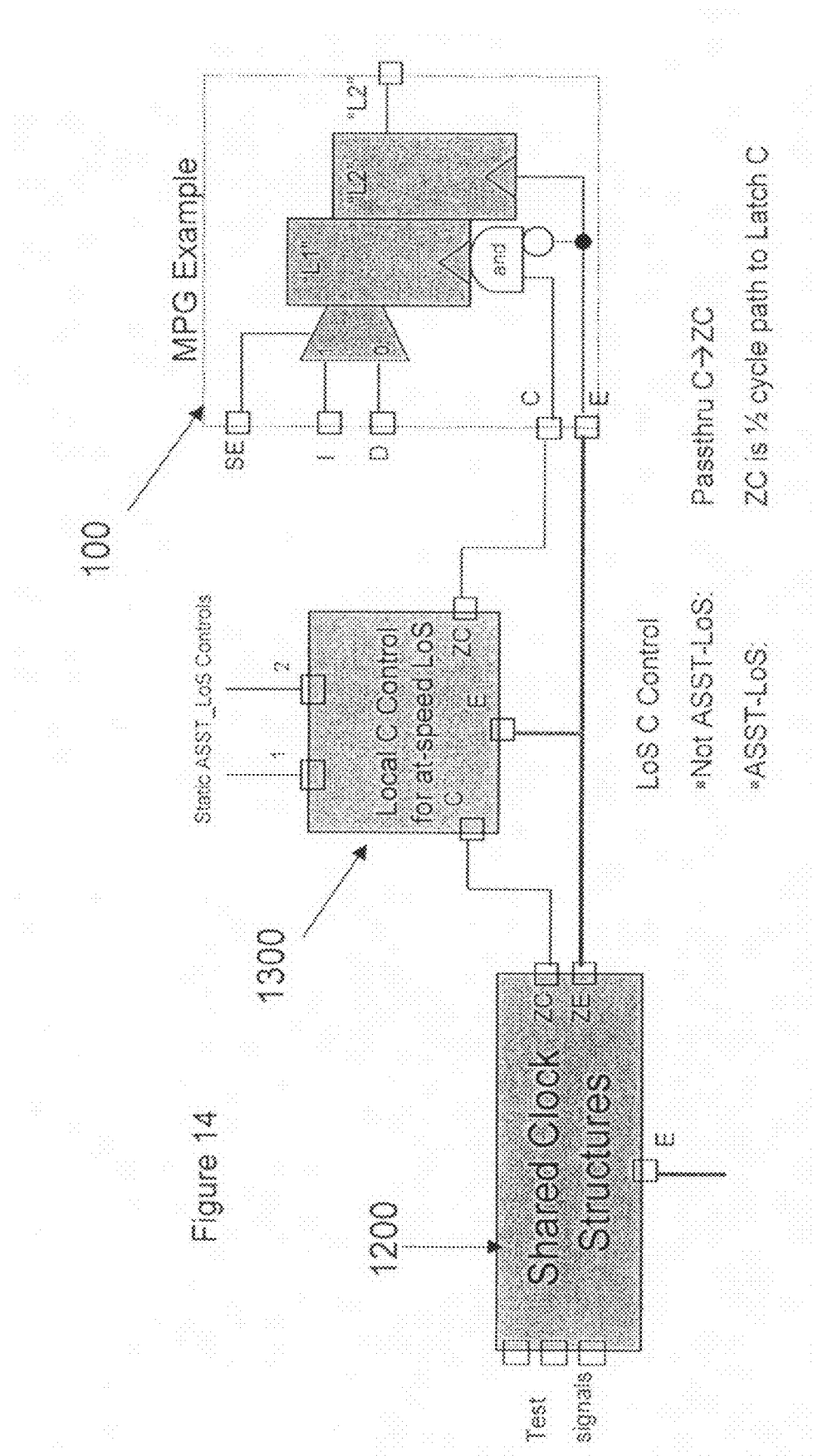
FIG. 14 shows a functional diagram of At-speed Launch-off-Scan (LoS) capabilities in accordance with the invention.

FIG. 14 shows a capability referred to as "At-speed Launch-off-Scan" (LoS). In the schematic of FIG. 14, the SCSP 300 (or SCSPN 500) and the SCSMSM 400 are combined as the block 1200 (Combined representation of Shared Clock Structures). An additional control block 1300 is added in the C path (SCSASST). The SCSASST 1300 provides unique control over the latch-pair plurality of C-pins (and therefore allows or blocks the L1 latch clocks from receiving an inverted edge clock, through the control of the AND gate in the latch pairs).

ZC begins low. Then, when ASST LoS control signals are set high, and two consecutive pulses are generated at E of 1300, the ZC signal is active high in response to the first posedge of E of 1300, and returns low during the second posedge of E of 1300. Therefore, the latch clocks receive the following sequence:

| L1 clock | L2 clock |
|----------|----------|
| 0 | 0 |
| 0 | 1 |
| 1 | 0 |
| 0 | 1 |
| 0 | 0 |

The above sequence tests the digital network at the frequency applied to the two clock pulses, which is intended to be at the frequency of system operation.

In the schematic, MPG is shown as example but LPG can be controlled equivalently, as can MTL and LTL (described above). As shown in FIG. 14, the ZC signal is input to the C pin of SCSASST 1300, and then the ZC signal is output to the C pin of the MPG 100. Also, the ZE signal is input to the E pin of SCSASST 1300, and to the E pin of the MPG 100.

Figure 15:
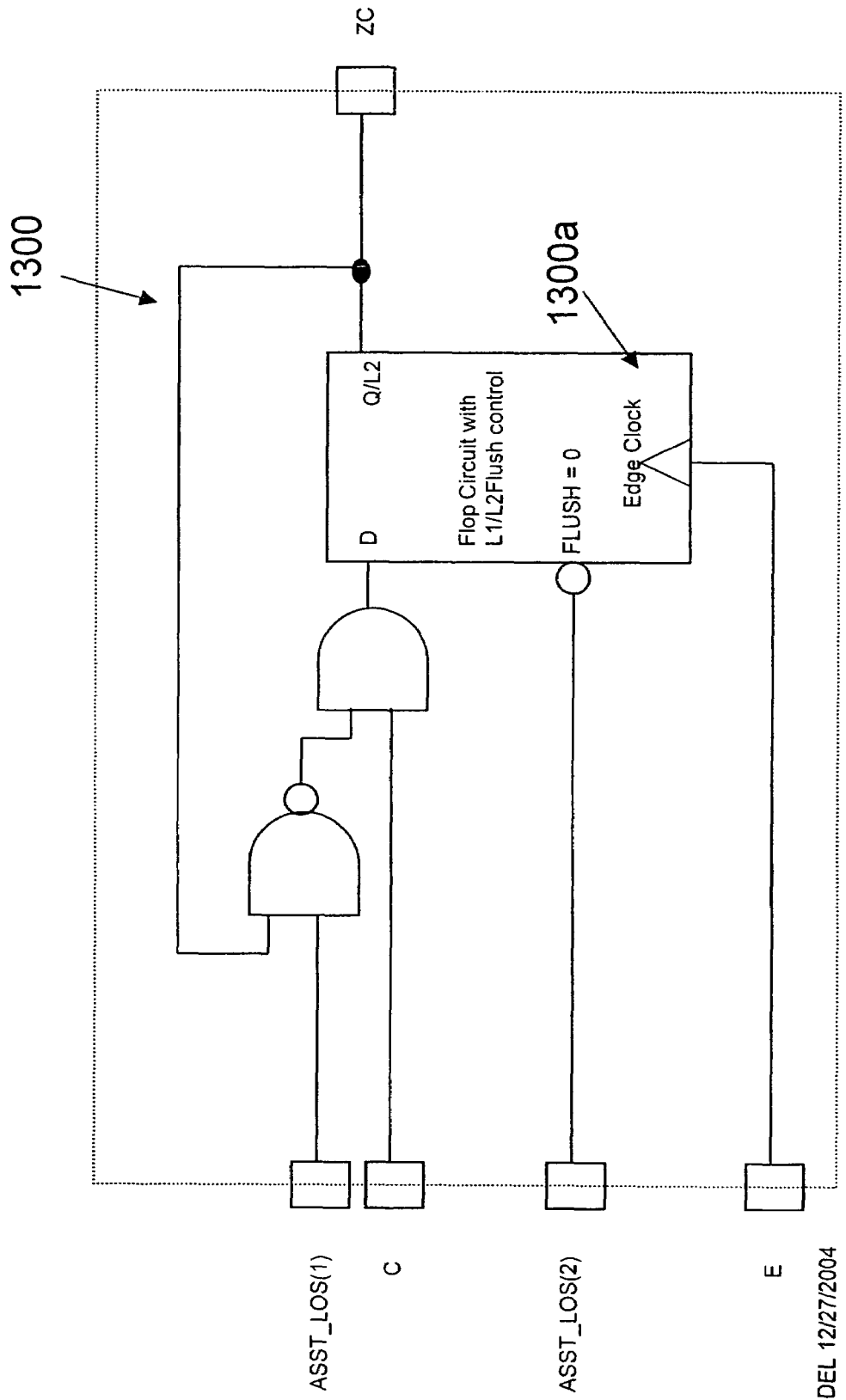
FIG. 15 shows a circuit diagram for the At-speed LoS.

An embodiment of the internal function of SCSASST 1300 is shown in FIG. 15, and an example of operation is shown in FIG. 16. The SCSASST 1300 allows testing of the digital network while running the clock at intended frequency. In one illustrative implementation, a test pattern can be loaded by scanning into all of the latches, L1 and L2. While the system clock (E) is held low, the two ASST_LoS signals are set high (1). This prepares the SCSASST 1300 for at-speed test operation. Then, when two sequential clock pulses are applied to E (at both block 1300 and the latches), the ZC output of 1300 and therefore C input to the latches is set high after the first E positive edge and is set low after the second positive edge of 1300. This allows the latches, L1 and L2, to capture data between the two pulses performed by the edge triggered flip flop operation of cell 1300*a*. The result is that the latches receive an L2 clock followed by an L1 clock followed by an L2 clock. The control signals of ASST_LOS(1) and ASST_LOS(2) propagate C to ZC when both are set low (ASST-LOS (1)=ASST_LOS(2)=0); this operation is intended for system operation, and the scan and test operations of LSSD or mux-scan.

More specifically, referring to FIGS. 15 and 16, in at-speed testing, the edge clock can be operated at its system operational frequency. In this embodiment, the edge clock is pulsed twice, and the desired clocking at the latch-pairs is the sequence: L2clock-L1clock-L2clock. This sequence is effective for testing system combinational and latch function, and timing performance of the system function including setup and hold performance of data versus clock arrivals at the latch pairs. In this embodiment, the C-pin at the latches is initially held low (block L1 clock), is then raised high by SCSASST in response to the first positive edge of the first pulse (allows L1 clock between the two pulse), and is then lowered by ASST in response to the second edge (blocks L1 clock after the second pulse).

The manner of at-speed LoS testing is supported by the three methods of scanning described by this invention: LSSD, edge-based Mux-scan, and race-mitigated mux-scan. In the LoS capability for at-speed testing, the at-speed test cycle responds directly to the test data pattern scanned in, whereas in the absence of LoS capability (commonly called launch-off-capture or LoC), the at-speed test cycle responds to the scanned pattern followed by one cycle (the first pulse), and thus the LoC test is a two cycle sequential test. (Two cycle tests (LoC) are more difficult to generate than one cycle (LoS), and more patterns are typically required.) For mux-scan LoS applications, the SCSASST method is one preferred method to the existing method of operating the scan path (SE=1) in the first cycle followed by the data path (SE=0) in the second cycle; the latter (existing) method results in both setup-timing and hold-timing risk at the scan input (I) of the latches, and for the SE input results in setup-timing risk (SE too late for the next system clock pulse) and hold-timing risk (SE too early for the current system clock pulse).

Figure 17:
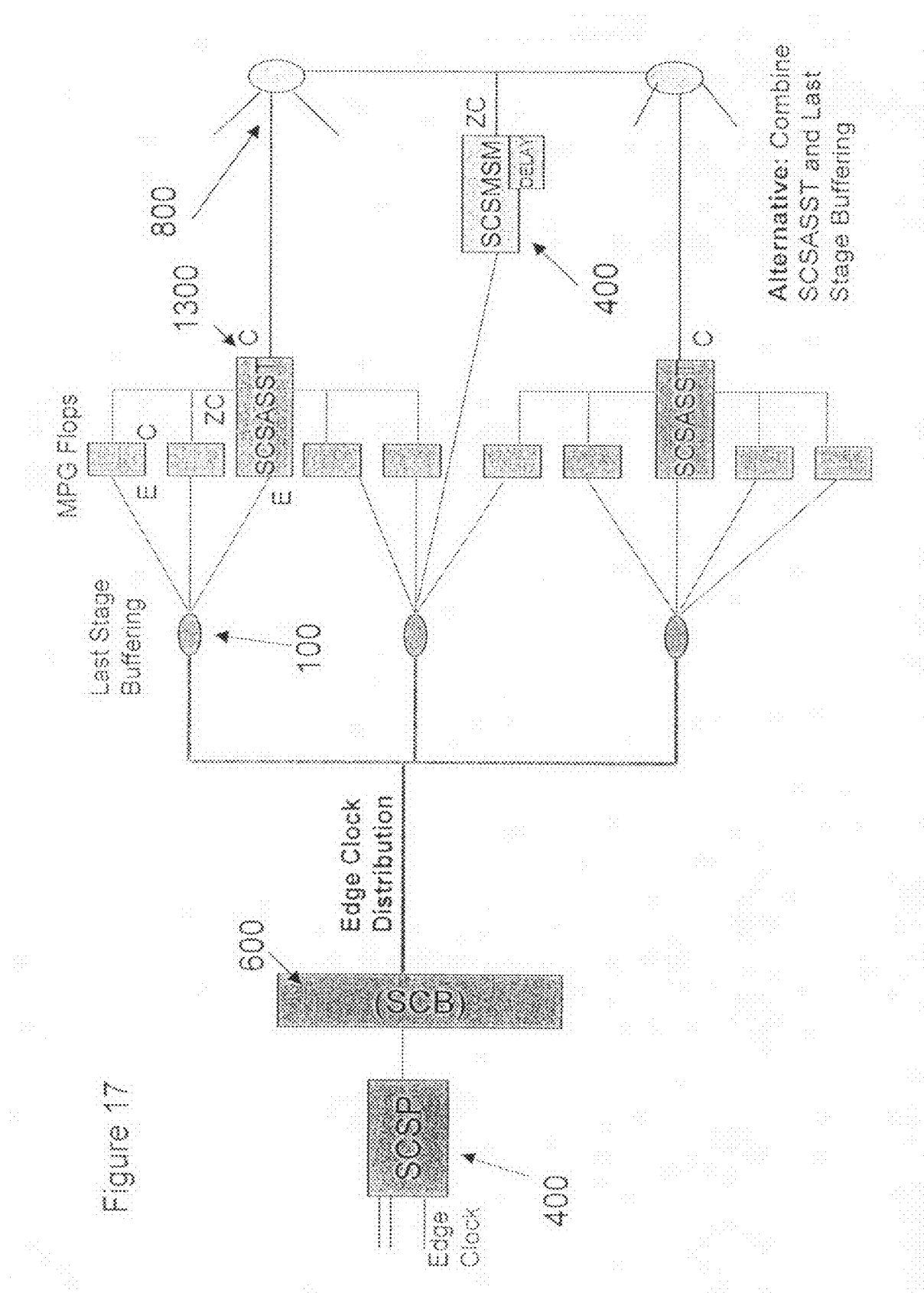
FIG. 17 shows a clock distribution example using the embodiment of FIG. 16.

FIG. 17 provides a non-limiting example of a clock distribution implemented for the MPG latch-pair plurality, and the LSSD and edge-based clock control needed for test operation, which incorporates SCSASST blocks to support at-speed LoS. FIG. 17 uses MPG latches as an example, however, LPG latches can be controlled by SCSASST is the same manner.

The SCB 600 (structured clock buffer) is an example of a clock buffer feeding the spine of the clock tree (e.g., clock distribution), with additional clock buffers 700 shown as an example. The SCSMSM 400 receives the E input to create the ZC signal. The ZC signal goes through the repowering tree 800 to the C input. The SCSASST 1300 receives the E input in addition to the ZC signal, and provides the ZC signal to the repowering tree 800 and the C input of the latches.

The timing requirement of the MPG C-pins for at-speed LoS operation, while continuing to support race-mitigated mux-scan, is shown as equations.

Latch Clock Gatinz Setup Requirement (Edge Clock tree Latency+SCSASST delay ($E{\rightarrow}ZC$)+ delay ($ZC{\rightarrow}MPG{:}C$))

Must be less than (Edge Clock tree Latency+½ edge_cycle+Setup requirement of [MPG: $E$ vs $C$])

Latch L1 Clock Pulse Width Requirement (Race-Mitigated Mux-Scan Only)

(Edge Clock tree Latency+DELAY+SCSMSM delay+ C–tree Latency+SCSASST($C{\rightarrow}ZC$)) Must be greater than(Edge Clock Tree Latency+$L1$ *clock pulse width requirement*)

Figure 18:
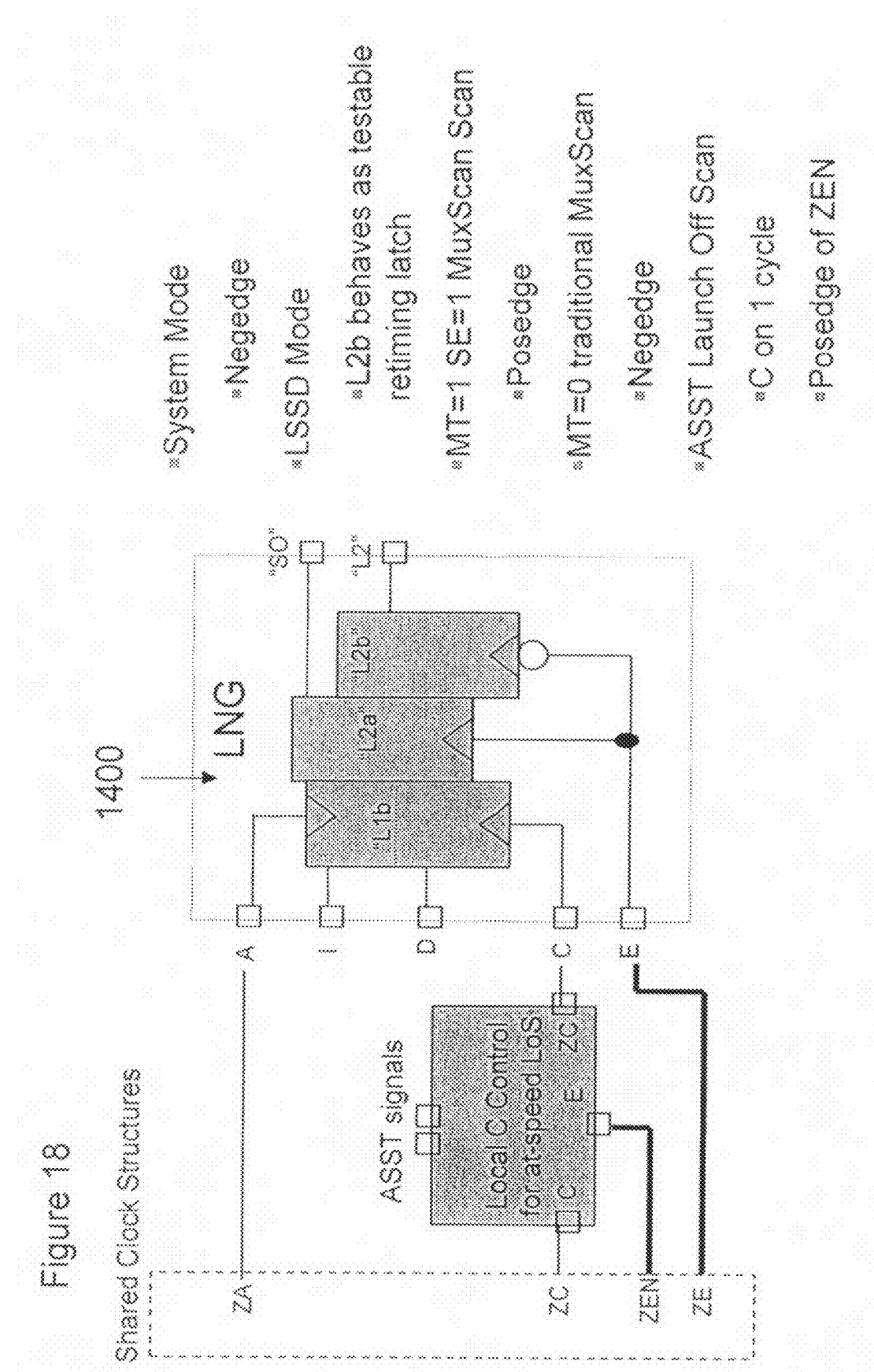
FIG. 18 shows an additional embodiment in accordance with the invention.

FIG. 18 shows an embodiment of the invention using an additional latch type referred to as an LNG (negative edge latch). The LNG 1400 provides a 2-port L1 latch function as example in the manner of the LPG 200. In this aspect of the invention, though, the 2-port L1 can be replaced by 1-port L1 plus data mux in the manner of the MPG 100 (i.e., NIG). The LNG 1400 (or MNG) provides negative-edge flop behavior in the system function environment when connected to the ZE output of the SCSP (or connected to ZEP of SCSPN). For edge-based mux-scan or race-mitigated mux-scan operation it provides positive edge (in-phase) behavior. For LSSD operation it is operated by individual (A,B,C) clocks. FIG. 18 also shows the SCSASST 1300 (at-speed LoS Support block); although, the SCSASST is optional for designs that do not require at-speed LoS operation. Mux-scan can be considered an option for the LNG implementation, in that in a chip embodiment where system operation and LSSD are the only modes to be supported for the said chip design, the A and C signals may be controlled directly by chip inputs (or C signal alone in the similar case of MNG).

For negative edge-triggered flop behavior, negative edge flops such as the LNG 1400 (or MNG) which connect to the positive clock, can have advantages over positive edge flops clocked by a negative clock; that is, an existing positive clock can be reused rather than creating an additional clock distribution for the negative clock. With this understanding, the negative clock distribution would increase clock skew between the flops having positive edge behavior and the flops having negative edge behavior.

While the invention has been described in terms of exemplary embodiments, those skilled in the art will recognize that the invention can be practiced with modifications and in the spirit and scope of the appended claims.

It is claimed:

1. An edge triggered system having a data and scan input, comprising:
    a latch device having a clock input; and
    an AND gate, coupled to said latch device, structured and arranged to receive a first clock signal and an inverted clock signal to generate a clock to said clock input,
    wherein the latch device and the AND gate are configured to provide mux-scan and LSSD testing capabilities, and
    further comprising a mux coupled to a data input and a scan input, wherein
    said latch device comprises at least a first and second latch, in which each latch has a clock input,
    said AND gate is coupled to said first latch, and a second clock signal is coupled to said clock input of said second latch, and
    a third clock signal, formed from the second clock signal, is coupled to said AND gate to form the inverted clock signal.

2. The edge triggered system in accordance with claim 1, wherein said second clock signal is coupled directly to said clock input of said second latch.

3. The edge triggered system in accordance with claim 1, wherein, for applications for the purpose of retiming latch and asynchronous storage latch, when said third clock signal is 0, said first latch captures data.

4. An edge triggered system having a data and scan input, said system comprising:
   a latch device having a clock input; and
   an AND gate, coupled to said latch device, structured and arranged to receive a first clock signal and an inverted clock signal to generate a clock to said clock input, wherein
   the latch device and the AND gate are configured to provide mux-scan and LSSD testing capabilities, wherein,
   said latch device comprises at least a first and second latch, in which each latch has at least one clock input,
   said AND gate is coupled to said first latch, and a second clock signal is coupled to said clock input of said second latch,
   a third clock signal is coupled to an inverted input of said AND gate to form the inverted clock signal, in a first implementation, said second clock is always high, such that, when the third clock signal is 0, data in said first latch in a first mode of operation goes immediately to an output of said second latch,
   when said first clock signal is held high and said third clock signal is held low, level sensitive behavior is achieved, whereby said first latch captures data and which is immediately available at the output of said second latch.

5. The edge triggered system in accordance with claim 4, wherein said second clock signal is coupled directly to said clock input of said second latch.

6. The edge triggered system in accordance with claim 4, wherein a pulsed gate device is operable as an asynchronous latch that captures data, when said third clock signal is low, and holds data when said third clock signal is high.

7. A process for operating an edge triggered system having a data and scan input, said process comprising:
   forwarding a first clock signal to an input of an AND gate,
   inverting a second clock signal forwarded to another input of the AND gate; and
   generating a clock input for a latch device from the AND gate,
   wherein the process is configured to provide mux-scan and LSSD testing capabilities,
   forwarding the second clock signal directly to the clock input of a second latch; and
   selecting between a data input and a scan input, the selection being under control of the clock from the AND gate.

8. The process in accordance with claim 7, wherein the latch device comprises at least a first latch and the second latch, in which each latch includes at least one clock input.

9. The process in accordance with claim 7, wherein the latch device includes another clock input, and the process further comprises forwarding a scan clock signal to the another clock input to select between the data input and the scan input.

10. The process in accordance with claim 7, further comprising performing at least one of LSSD and mux scan applications.

11. A process for operating an edge triggered system having a data and scan input, comprising:
   generating a clock to a clock input based on a received first clock signal and an inverted clock signal in order to provide mux-scan and LSSD testing capabilities;
   generating a second clock signal to a second clock input; and
   inverting the second clock signal to form the inverted clock signal, which is coupled to an AND gate connected to the clock input.

* * * * *